United States Patent
Modica et al.

(10) Patent No.: US 7,808,298 B1
(45) Date of Patent: Oct. 5, 2010

(54) THERMAL COMPENSATION OF AN EXPONENTIAL PAIR

(75) Inventors: Eric Modica, San Jose, CA (US); Derek Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 31 days.

(21) Appl. No.: 12/402,388

(22) Filed: Mar. 11, 2009

(51) Int. Cl.
*H01L 35/00* (2006.01)
(52) U.S. Cl. .............................. 327/513; 327/563
(58) Field of Classification Search ............... 327/512, 327/513, 561, 562, 563
See application file for complete search history.

(56) References Cited

U.S. PATENT DOCUMENTS

| | | | |
|---|---|---|---|
| 3,495,182 A | 2/1970 | Smith et al. | |
| 4,339,707 A | 7/1982 | Gorecki | |
| 5,079,454 A * | 1/1992 | Benton et al. | 327/65 |
| 5,352,973 A | 10/1994 | Audy | |
| 5,389,889 A | 2/1995 | Towne et al. | |
| 7,474,133 B1 * | 1/2009 | Aude et al. | 327/108 |

OTHER PUBLICATIONS

International Search Report dated May 12, 2010, in counterpart international application No. PCT/US2010/026958.

* cited by examiner

*Primary Examiner*—Jeffrey S Zweizig
(74) *Attorney, Agent, or Firm*—Kenyon & Kenyon LLP

(57) ABSTRACT

To compensate for changes in temperature, a pair of bipolar transistors is connected to a voltage divider and receives a differential voltage that varies with temperature. The voltage divider includes a set of resistors placed in parallel. The set of resistors has a resistance that changes with temperature. As the resistance changes with temperature, the differential voltage provided by the voltage divider changes in proportion to a change in thermal voltage.

22 Claims, 2 Drawing Sheets

THERMAL COMPENSATION OF AN EXPONENTIAL PAIR

BACKGROUND

1. Field of the Invention

Aspects of the present invention relate generally to an differential pair of transistors, and more particularly to compensation of temperature differences in the differential pair.

2. Description of Related Art

A differential amplifier is a commonly used building block of analog integrated circuits. The differential amplifier can be implemented using bipolar junction transistors ("BJT") or field effect transistors, such as MOSFETs. A commonly used BJT differential amplifier includes a pair of transistors whose emitters are connected. The emitters of the BJTs may be biased by a common current source I, such that the collector currents for the two transistors sum to equal I. Assuming the transistors are matched and no differential signal is applied to the bases of the differential pair, an equal amount of current will flow through the two transistors. However, if a differential signal is applied to the bases of the two transistors, the bias current flowing through the collectors of the two transistors will be unequal. This collector current can be calculated as an exponential function of the differential signal and the thermal voltage, $V_T$, where $V_T$ is equal to Boltzmann's constant, k, multiplied by temperature (in degrees Kelvin) divided by the charge of an electron, q. The equation can be expressed as $I_2/I_1 = e^{(V_{diff}/V_T)}$, where $I_1 + I_2 = I$ and $V_{diff}$ is the differential signal applied to the bases of the transistors.

Because the thermal voltage, $V_T$, is proportional to absolute temperature, the bias currents flowing through the transistors also vary with temperature. However, for certain applications, it is undesirable for the bias currents to drift with temperature. The above equation suggests that if the first order derivative $dV_{diff}/dT$ is equal to the derivative $dV_T/dT$, the quotient $V_{diff}/V_T$ would remain constant over temperature, and similarly, the quotient $I_2/I_1$ would remain constant over temperature. It follows that if the current source I is also held constant, then the absolute values of both $I_1$ and $I_2$ would remain constant.

Therefore, it may be desirable to provide a circuit arrangement that maintains a constant collector current relative to variations in temperature.

SUMMARY

Embodiments of the present invention overcome the above-mentioned and various other shortcomings of conventional technology, providing a pair of bipolar transistors that receive a differential voltage. The differential voltage may be provided to the bipolar transistors by a voltage divider that receives an input voltage. The voltage divider may include a set of resistors having a resistance that changes with temperature. As the resistance of the set of resistors changes, the differential voltage provided by the voltage divide may change in proportion to a change in thermal voltage.

The foregoing and other aspects of various embodiments of the present invention will be apparent through examination of the following detailed description thereof in conjunction with the accompanying drawing figures.

BRIEF DESCRIPTION OF THE DRAWING FIGURES

DETAILED DESCRIPTION

It will be appreciated from the following description that the embodiments set forth herein may have utility in connection with a monolithic waveform generator, an exponential converter, or generally any operational amplifier or circuit having an application that requires temperature compensation or bias currents that remain constant in the face of temperature variations.

Figure 1:
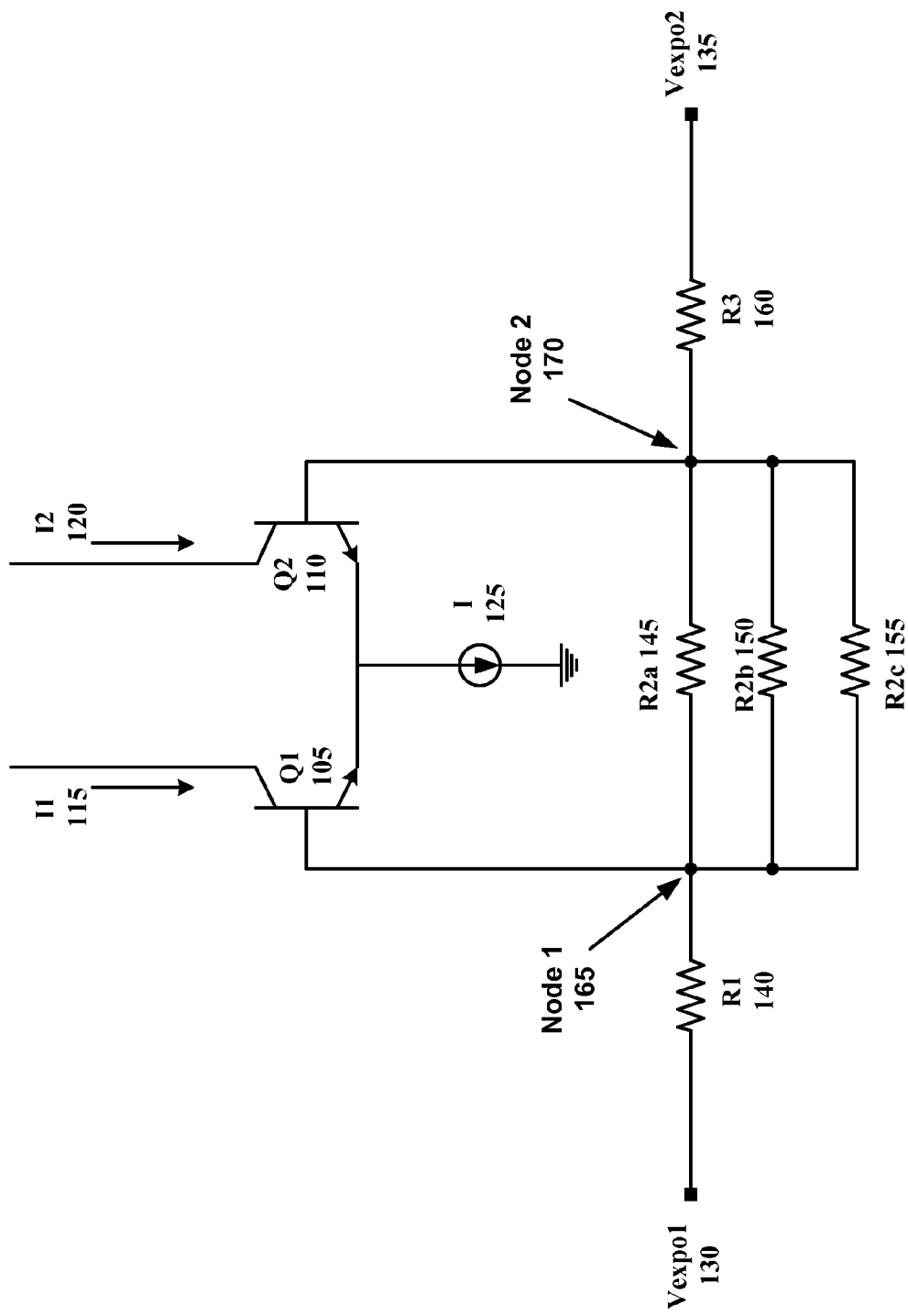
FIG. 1 is a schematic diagram of an embodiment of a portion of a differential amplifier.

By way of illustration, FIG. 1 is a schematic diagram of an embodiment of a differential amplifier circuit. Transistors Q1 105 and Q2 110 may be n-type bipolar junction transistors. Transistors Q1 105 and Q2 110 may be identical or matching transistors. The transistors Q1 105 and Q2 110 may be connected together at their respective emitters. The emitters of the transistors may be biased by current source I 125. The collectors of transistors Q1 105 and Q2 110 may be connected to a load. The bases of transistors Q1 105 and Q2 110 may be connected to differential inputs $V_{EXPO1}$ 130 and $V_{EXPO2}$ 135 through a resistor network.

The resistor network may include a first resistor R1 140 connected at one end to differential input $V_{EXPO1}$ 130 and connected at the other end in series to three resistors in parallel—R2a 145, R2b 150, and R2c 155. The parallel resistors may be connected to resistor R3 160 in series. Resistor R3 160 may be connected at the other end to differential input $V_{EXPO2}$ 135. Differential inputs $V_{EXPO1}$ 130 and $V_{EXPO2}$ 135 may be external pins.

A current $I_1$ 115 may flow through the collector of transistor Q1 105, while a current $I_2$ 120 may flow through the collector of transistor Q2 110. If base currents are neglected, the sum of currents $I_1$ 115 and $I_2$ 120 equals the biased current source 1125. The ratio of the two currents $I_1$ 115 and $I_2$ 120 is equal to $e^{(V_{diff}/V_T)}$, where the thermal voltage $V_T$ is equal to kT/q, with k being Boltzmann's constant, T being the absolute temperature (in Kelvin), and q being the magnitude of the electrical charge (in coulombs) on the electron. The ratio of the two currents $I_1$ 115 and $I_2$ 120 also can be expressed as $I_2/I_1 = e^{(q*V_{diff}/kT)}$. Thus, the ratio of currents $I_1$ 115 and $I_2$ 120 will vary with changes in temperature.

In certain applications, it is desirable to maintain the ratio of the currents 115 and $I_2$ 120 with temperature. In one embodiment, compensation for temperature changes can be accomplished by making $V_{diff}$ proportional to temperature, such that when the temperature changes, $V_{diff}$ also will change. The effect of making $V_{diff}$ proportional to temperature is to keep the ratio $I_2/I_1$ constant with respect to changes in temperature. In one embodiment, the resistor network of FIG. 1 may operate to make $V_{diff}$ proportional to temperature.

One characteristic of a resistor is its temperature behavior. The temperature behavior of a resistor characterizes how the resistor reacts to changes in temperature. The temperature behavior of a resistor can be expressed as $R(T) = R(T_{ROOM}) * (1 + T_{C1} * T_{diff} + T_{C2} * T_{diff}^2)$, where $R(T_{ROOM})$ is the resistor value at room temperature, $T_{C1}$ is the linear temperature coefficient of the resistor, $T_{C2}$ is the square temperature coefficient of the resistor, and $T_{diff}$ is the difference between actual temperature and room temperature. The temperature coefficient of a resistor dictates the degree to which the resistance of a resistor varies with temperature. For example, a resistor with a positive temperature coefficient may become more resistive as temperature increases, while a resistor with a negative temperature coefficient may become more resistive as temperature decreases.

The resistor network of FIG. 1 may operate as a voltage divider to provide a differential voltage to transistors Q1 105 and Q2 110 that is reduced from the input voltage applied to external pins $V_{EXPO1}$ 130 and $V_{EXPO2}$ 135. The voltage existing at Node 1 165 and Node 2 170 may be the differential voltage applied to transistors Q1 105 and Q2 110. Compensation for changes in temperature may be accounted for by the set of resistors placed in parallel. The resistors, shown in the embodiment of FIG. 1 as resistors R2a 145, R2b 150, and R2c 155, may be conventional resistors, such as thin film resistors, diffused base resistors, or super beta resistors. Each type of resistor may react differently to temperature changes. For example, thin film resistors are generally stable in resistance relative to changes in temperature, while diffused base resistors have a resistance that increases almost in proportion to a temperature change. Super beta diffused base resistors are lightly doped and have a resistance that increases greatly relative to a temperature change. Thus, the use of conventional resistors, such as the resistors described herein, offers flexibility in designing a circuit that compensates for changes in temperature by avoiding the need for a specially engineered resistor specifically designed to compensate for bias current variations with temperature. These specially engineered resistors are designed only for this purpose.

In the embodiment of FIG. 1, resistors R1 140, R2a 145, and R3 160 may be thin film resistors with relatively low temperature coefficients. In one embodiment, the value of resistor R2a 145 may be approximately 5.83e3 ohms, while value of resistors R1 140 and R3 160 is approximately 15e3 ohms. In one embodiment, resistor R2a is trimmable, such that the equivalent temperature coefficient of the parallel combination of resistors R2a, R2b, R2c can be adjusted or set precisely. The method by which the resistor is trimmed is not intended to be limiting, and could involve, for example, abrasion or laser trimming. Resistors R2b 150 and R2c 155 may be diffused base resistors with large positive first order temperature coefficients. In one embodiment, resistor R2b 150 may be constructed of an npn base diffusion and may have a resistance value of 4.4e3 ohms at room temperature, which is 27 degrees Celsius, a linear temperature coefficient of 2.9e-3 ohms, and a square temperature coefficient of 6.87e-6. In one embodiment, resistor R2b 150 is implanted with dopant ions, such as boron, arsenic, or phosphorus. In one embodiment, resistor R2b 150 may have a boron implant within ±2% of a nominal concentration of $2.0e14$ atoms/cm$^2$. Resistor R2c 155 may be constructed of a superbeta npn base diffusion and may have a resistance value of 7.5e3 ohms at room temperature (27° C.), a linear temperature coefficient of 2.9e-3, and a square temperature coefficient of 6.87e-6. In one embodiment, resistor R2c 155 also is implanted with dopant ions, such as boron, arsenic, or phosphorus. In one embodiment, resistor R2c 155 may have a boron implant within ±2% of a nominal concentration of $3.5e12$ atoms/cm$^2$. Resistor R2a 145 can be trimmed to adjust for variations in ion implantation concentration from die to die or wafer to wafer.

With the resistor configuration of FIG. 1, as the temperature increases above room temperature, the resistance of the parallel combination of resistors R2a 145, R2b 150, and R2c 155 increases with respect to resistors R1 140 and R3 160. The increase in resistance of the parallel resistors raises the differential voltage applied to transistors Q1 105 and Q2 110, as $V_{diff}$ is equal to $V_{EXPO}*(R2/(R1+R2+R3))$, where $V_{EXPO}$ represents the voltage applied to external pins $V_{EXPO1}$ and $V_{EXPO2}$, and R2 represents the parallel combination of R2a 145, R2b 150, and R2c 155. Resistors R2b 150 and R2c 155 may be selected based on the degree to which their temperature coefficients increase their resistivity as temperature increases, such that the increased differential voltage applied to transistors Q1 105 and Q2 110 is proportional to the increase in thermal voltage $V_T$ caused by the increase in temperature. One of skill in the art should recognize that the selection of resistors will depend on the degree to which temperature compensation is needed or desired, and that different numbers of and configuration of resistors may be used.

Figure 2:
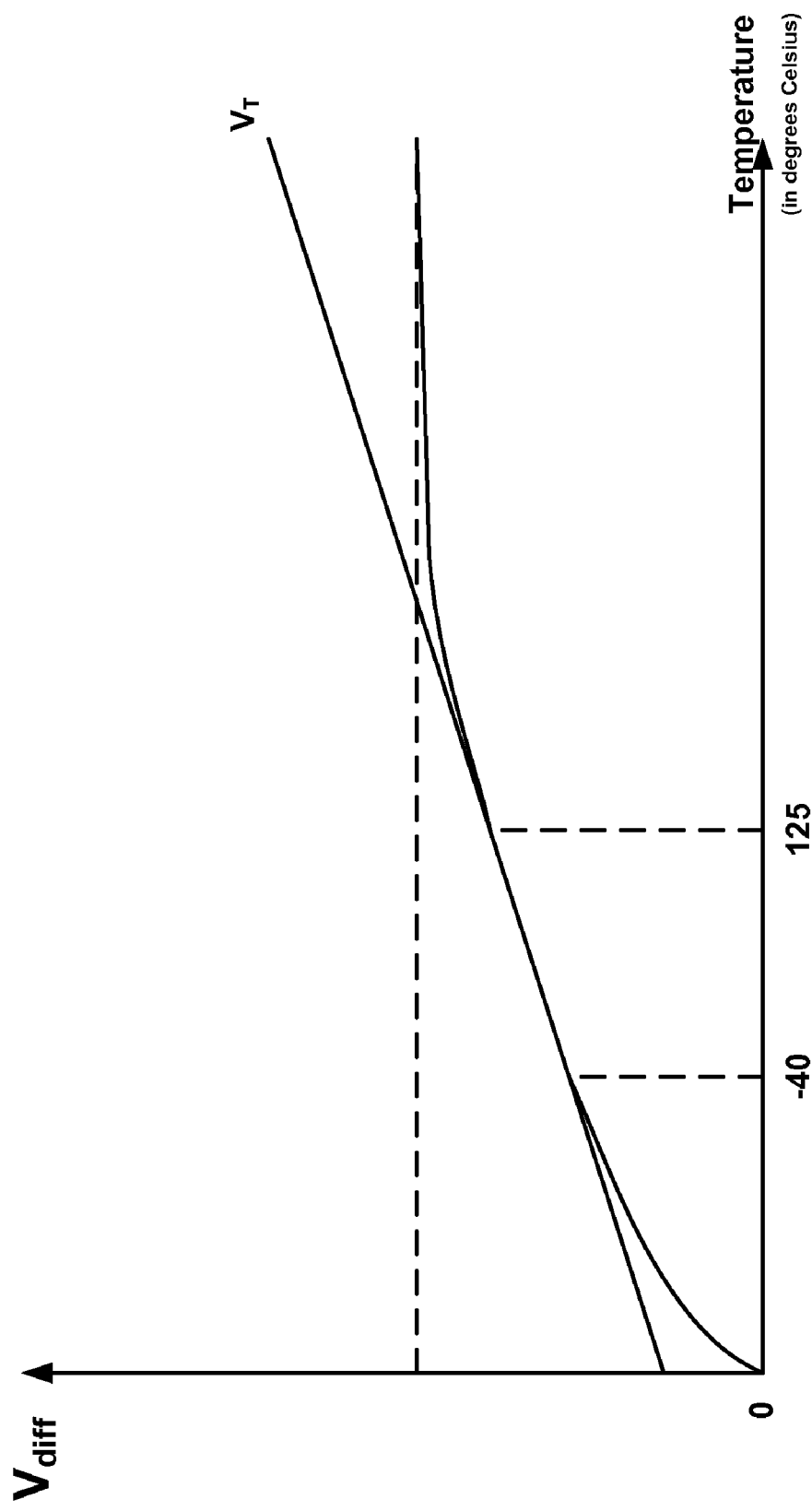
FIG. 2 is a graph of the differential voltage and thermal voltage as a function of temperature for an embodiment of the differential amplifier.

FIG. 2 graphically illustrates the differential voltage and thermal voltage as a function of temperature for an embodiment of the differential amplifier. In the embodiment of FIG. 1, a resistor network having a set of resistors with varying temperature coefficients in parallel may operate to render a input differential voltage $V_{diff}$ proportional to temperature, such that the ratio of bias currents flowing through two transistors Q1 105, Q2 110 in a differential pair remains constant in the face of changing temperature. The resistor network may operate as a voltage divider to divide the voltage input to external pins $V_{EXPO1}$ 130 and $V_{EXPO2}$ 135. The differential voltage input to transistors Q1 105 and Q2 110 may be obtained from the nodes N1 165 and N2 170. The voltage $V_{diff}$ at these nodes can be calculated as $V_{diff}=V_{EXPO}*(R2/(R1+R2+R3))$, where R2 is calculated from the resistances of R2a 145, R2b 150, and R2c 155 in parallel. R2 will vary with temperature due to the large positive temperature coefficients of resistors R2b 150 and R2c 155. Given that R2 varies with temperature, and that $V_{diff}$ is calculated as a function of R2, the relationship between the differential voltage $V_{diff}$ and temperature may be characterized by an asymptotic curve. As resistors R1 and R3 are generally stable with respect to temperature (e.g., thin film resistors with low temperature coefficients), $V_{diff}$ in essence may exhibit the behavior of the equation $x/(x+1)$. One of ordinary skill in the art should readily understand that the values of $V_{diff}$ and the temperature range shown in FIG. 2 are exemplary. The value of $V_{diff}$ and its asymptotic behavior may change depending on the values of resistors R2a 145, R2b 150, and R2c 155 and their respective temperature coefficients.

When compared to the thermal voltage $V_T$, which exhibits a linear relationship with temperature, resistors having certain temperature coefficients may be selected such that the combination of resistors in the resistor network may result in the asymptotic behavior of $V_{diff}$ matching the slope of the thermal voltage as close as possible over a relevant temperature range. In one embodiment, the operating temperature range for a circuit having the resistor network of FIG. 1 may be −40° C. to 125° C. Additionally, $V_{diff}$ temperature dependence can be further manipulated by trimming one or more resistors in the resistor network. By selecting and/or trimming the resistors R2a 145, R2b 150, and R2c 155, the differential input voltage $V_{diff}$ can be made proportional or as proportional as possible to the thermal voltage.

Additional embodiments of the present invention may employ unity gain buffers (not shown) or other integrated circuit components electrically connected to the bases of transistors Q1 105 and Q2 110 to compensate for base currents in transistors Q1 105 and Q2 110.

Additional embodiments of the present invention further may replace or supplement any or all of resistors R2a 145, R2b 150, and R2c 155 with discrete components, such as resistors or compensators. "Compensator" is a term known in the art that is used to describe a resistor that is specially engineered to have a first order temperature coefficient ("tempco") that is proportional to temperature. For example, The Precision Resistor Company manufactures a series of "PTcompensators", or positive tempco compensators, that have a positive first order tempco of +3500 ppm/° C.

The number and selection of resistors disclosed in the embodiments herein are merely exemplary and not intended to be limiting. For instance, while three resistors—R2a 145, R2b 150, and R2c 155—have been placed in parallel to compensate for temperature variations, it is contemplated that more or less than three resistors may be used. As many or few resistors may be used in the voltage divider provided that the temperature coefficients of the resistors used alter the applied differential voltage to equal or approximate the thermal voltage (and any temperature changes affecting the thermal voltage) over a given temperature range by raising the resistance of the set of resistors placed in parallel.

Any of the embodiments disclosed herein may be part of or connected to a waveform generator, exponential converter, or other integrated circuit having an application that requires temperature compensation or bias currents that remain constant in the face of temperature variations.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. For example, the foregoing embodiments have been described using transistors of a particular type (e.g., n-type, p-type). It will be apparent that inputs and transistor types can be varied to as to vary the circuit configuration, while providing the same effect. Also, for example, the foregoing embodiments have been described with respect to bipolar transistors. It will be apparent that other transistors may be used instead, while providing the same effect. For instance, the present invention may be applicable to MOS transistors, with a gate of a MOS transistor corresponding to the base of a bipolar transistor, the drain of a MOS transistor corresponding to the collector of a bipolar transistor, and the source of a MOS transistor corresponding to the emitter of a bipolar transistor. Use of MOS transistors in place of bipolar transistors may eliminate any base current errors associated with bipolar transistors. Therefore, it is intended that the invention be considered as limited only by the scope of the appended claims.

What is claimed is:

1. A circuit, comprising:
   first and second bipolar transistors each having a respective base; and
   a voltage divider comprising a first resistor electrically connected in series to a set of resistors at a first node and a second resistor electrically connected in series to the set of resistors at a second node,
   wherein the base of the first bipolar transistor is connected to the first node and the base of the second bipolar transistor is connected to the second node, and
   wherein the set of resistors includes a first thin film resistor electrically connected in parallel to a first diffused base resistor which is electrically connected in parallel to a second diffused base resistor.

2. The circuit of claim 1, wherein the second diffused base resistor is a superbeta diffused base resistor.

3. The circuit of claim 1, further comprising a first input voltage pin electrically connected to the first resistor and a second input voltage pin electrically connected to the second resistor.

4. The circuit of claim 3, wherein the first and the second bipolar transistors further include respective collectors and emitters, the emitters of the first and the second bipolar transistors connected to each other and a first current source.

5. The circuit of claim 4, wherein the first current source equals a sum of a first bipolar transistor collector current and a second bipolar transistor collector current.

6. The circuit of claim 4, wherein a ratio of a first bipolar transistor collector current to a second bipolar transistor collector current is calculated as a function of temperature.

7. The circuit of claim 1, wherein the first thin film resistor is trimmable to adjust a temperature dependence of the parallel set of resistors.

8. The circuit of claim 1, wherein the first diffused base resistor and the second diffused base resistor each have positive temperature coefficients.

9. The circuit of claim 1, wherein the set of resistors has a temperature coefficient that increases a voltage applied to the first and the second bipolar transistors in proportion to an increase in temperature.

10. The circuit of claim 1, further comprising a first unity gain buffer connected to the base of the first bipolar transistor and a second unity gain buffer connected to the base of the second bipolar transistor.

11. The circuit of claim 1, wherein the first base diffused resistor has a first boron implant with a first concentration of approximately 2.0e14 atoms/$cm^2$, and wherein the second base diffused resistor has a second boron implant with a second concentration of approximately 3.5e12 atoms/$cm^2$.

12. A circuit, comprising:
    first and second bipolar transistors to receive a differential voltage; and
    a voltage divider to receive an input voltage and provide the differential voltage to the first and the second bipolar transistors, the voltage divider comprising a set of resistors placed in parallel, the set of resistors having a resistance that varies with temperature,
    wherein the provided differential voltage changes in proportion to a change in a thermal voltage.

13. The circuit of claim 12, wherein the set of resistors comprises at least two resistors.

14. The circuit of claim 12, wherein the set of resistors comprises a thin film resistor placed in parallel with a first diffused base resistor which is placed in parallel with a second diffused base resistor.

15. The circuit of claim 14, wherein the second diffused base resistor is a superbeta diffused base resistor.

16. The circuit of claim 14, wherein the first diffused base resistor and the second diffused base resistor each have a positive temperature coefficient.

17. The circuit of claim 14, wherein the thin film resistor is trimmable to adjust a temperature dependence of the parallel set of resistors.

18. The circuit of claim 12, wherein a ratio of a first bipolar transistor collector current to a second bipolar transistor collector current is calculated as a function of the differential voltage and the thermal voltage.

19. The circuit of claim 12, wherein the differential voltage changes in proportion to the thermal voltage change over a range of temperature.

20. The circuit of claim 19, wherein the range of temperature is from −40° Celsius to 125° Celsius.

21. The circuit of claim 14, wherein the first base diffused resistor has a first boron implant with a first concentration of approximately 2.0e14 atoms/$cm^2$, and wherein the second base diffused resistor has a second boron implant with a second concentration of approximately 3.5e12 atoms/$cm^2$.

22. A circuit, comprising:

first and second amplifying means to receive a differential voltage; and voltage dividing means to receive an input voltage and provide a differential voltage to the first and the second amplifying means, the voltage dividing means comprising a set of resistive means placed in parallel, the set of resistive means having a resistance that varies with temperature, wherein the provided differential voltage changes in proportion to a change in a thermal voltage.

* * * * *